United States Patent
Lin et al.

(10) Patent No.: US 9,385,080 B2
(45) Date of Patent: Jul. 5, 2016

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Yu-Hung Lin, Taichung (TW); Mei-Hui Fu, Hsin-Chu (TW); Wei-Jung Lin, Taipei (TW); You-Hua Chou, Hsin-Chu (TW); Chia-Lin Hsu, Tainan (TW); Hon-Lin Huang, Hsin-Chu (TW); Shih-Chi Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/461,285

(22) Filed: Aug. 15, 2014

(65) Prior Publication Data

US 2016/0049362 A1    Feb. 18, 2016

(51) Int. Cl.
| | |
|---|---|
| *H01L 23/528* | (2006.01) |
| *H01L 21/285* | (2006.01) |
| *H01L 21/768* | (2006.01) |
| *H01L 23/522* | (2006.01) |
| *H01L 23/532* | (2006.01) |

(52) U.S. Cl.
CPC ........ *H01L 23/528* (2013.01); *H01L 21/28518* (2013.01); *H01L 21/76802* (2013.01); *H01L 21/76834* (2013.01); *H01L 21/76843* (2013.01); *H01L 21/76877* (2013.01); *H01L 21/76889* (2013.01); *H01L 21/76897* (2013.01); *H01L 23/5226* (2013.01); *H01L 23/5329* (2013.01); *H01L 23/53209* (2013.01); *H01L 23/53261* (2013.01); *H01L 23/53266* (2013.01)

(58) Field of Classification Search
None
See application file for complete search history.

(56) References Cited

U.S. PATENT DOCUMENTS

| | | | | |
|---|---|---|---|---|
| 2006/0251800 | A1* | 11/2006 | Weidman | B82Y 30/00 427/99.5 |
| 2010/0320604 | A1* | 12/2010 | Isobayashi | H01L 21/76805 257/751 |
| 2011/0024908 | A1* | 2/2011 | Lee | H01L 21/76846 257/751 |
| 2011/0057317 | A1* | 3/2011 | Koike et al. | 257/751 |

\* cited by examiner

*Primary Examiner* — Khaja Ahmad
(74) *Attorney, Agent, or Firm* — Slater Matsil, LLP

(57) ABSTRACT

An interconnect structure and a method of forming an interconnect structure are disclosed. The interconnect structure includes a contact layer over a substrate; a dielectric layer over the contact layer, wherein the dielectric layer has an opening, the opening exposing a portion of the contact layer; a silicide layer over the exposed portion of the contact layer; a barrier layer along sidewalls of the opening; an alloy layer over the barrier layer; a glue layer over the alloy layer; and a conductive plug over the glue layer.

20 Claims, 9 Drawing Sheets

INTERCONNECT STRUCTURE AND METHOD OF FORMING THE SAME

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, there is a trend towards thinner films being used for the diffusion barrier layer that is typically formed between the metal interconnect material and the dielectric material. Accordingly a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
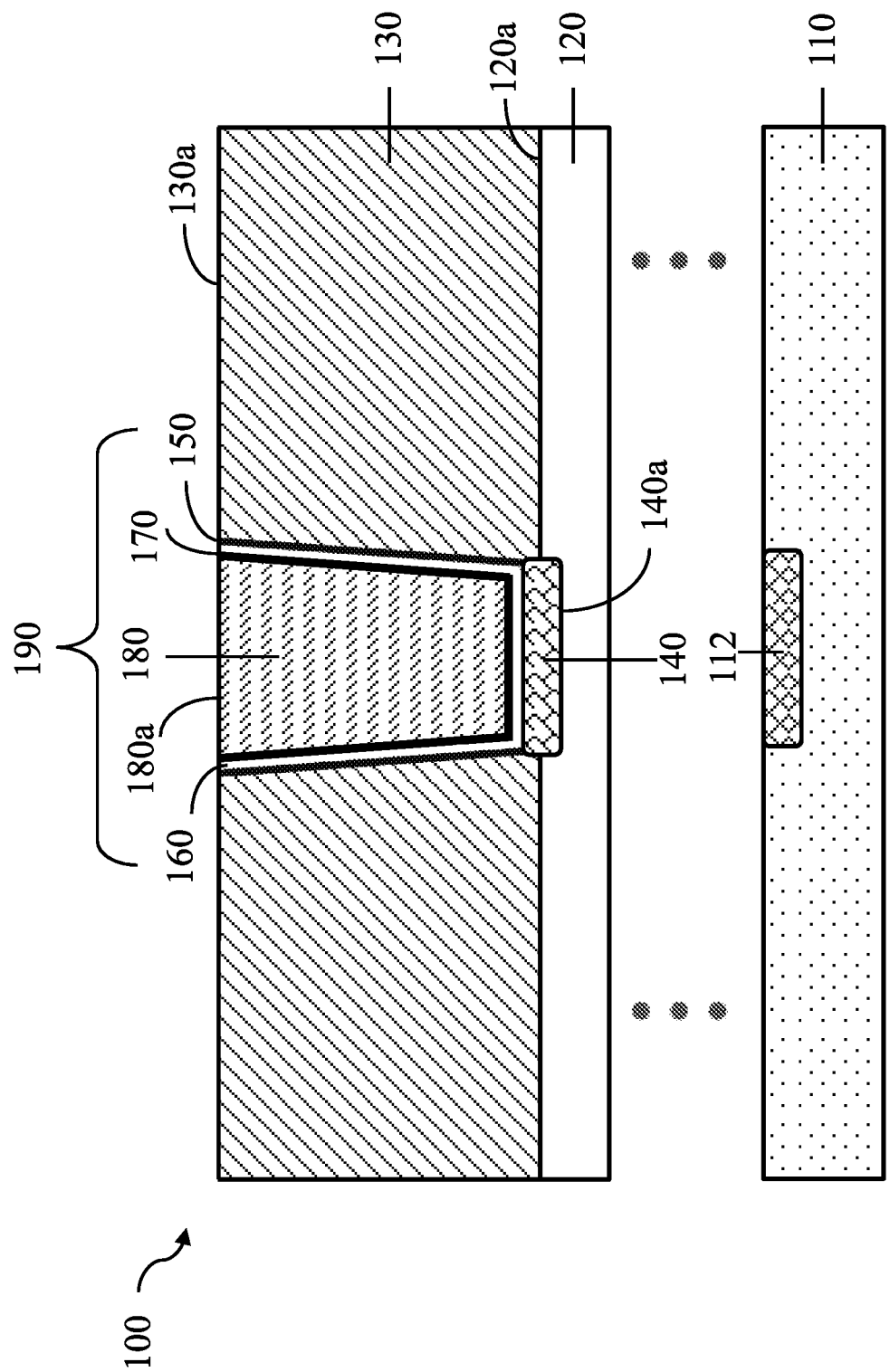
FIG. 1 is a cross-sectional view of an interconnect structure 100 according to various aspects of the present disclosure.

The present disclosure relates generally to semiconductor structures, and more particularly, to methods of forming an interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper", "over", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 4:
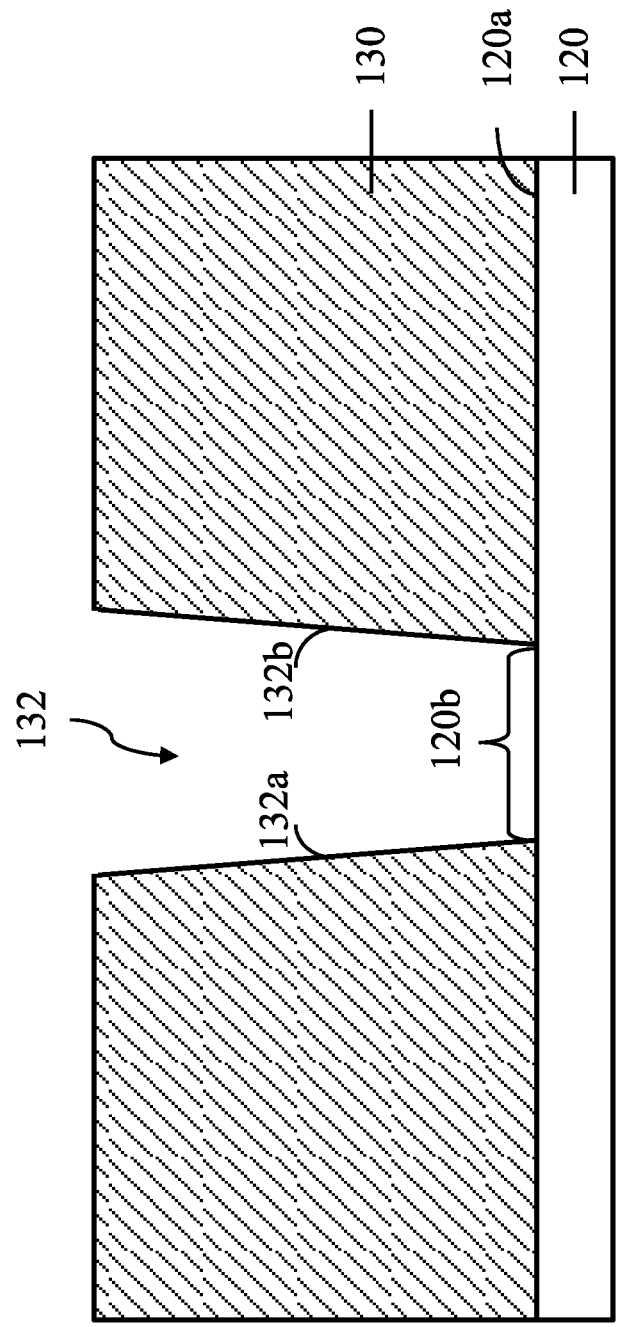

FIG. 1 is a cross-sectional view of an interconnect structure 100 according to various aspects of the present disclosure. As depicted in FIG. 1, the interconnect structure 100 comprises a contact layer 120 over a substrate 110; a dielectric layer 130 over the contact layer 120, wherein the dielectric layer 130 has an opening 132, the opening 132 exposing a portion 120b of the contact layer 120 (as illustrated in FIG. 4); a silicide layer 140 over the exposed portion 120b of the contact layer 120; a barrier layer 150 along sidewalls 132a and 132b of the opening 132 (as illustrated in FIG. 4); an alloy layer 160 over the barrier layer 150; a glue layer 170 over the alloy layer 160; and a conductive plug 180 over the glue layer 170. For ease of explanation, the features described herein are described as they appear in cross-section view. In an actual device, however, the features are three-dimensional structures. So, for instance, even though an opening is illustrated and described herein as having sidewalls, in an actual device the opening will in reality have a single continuous sidewall that is continuous across its entire periphery. Stated another way, when an opening, such as the opening 132 described with reference to FIG. 4 is described as having a first sidewall 132a and a second sidewall 132b, one skilled in the art will recognize that these features are simply different portions of a single continuous sidewall defining the periphery of opening.

The substrate 110 may be a part of a wafer and may include a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 110 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or a combination thereof. The substrate 110 may be doped with a p-type dopant, such as boron, aluminum, gallium, or the like, although the substrate may alternatively be doped with an n-type dopant, as is known in the art.

The substrate 110 may include active and passive devices 112. As one of ordinary skill in the art will recognize, a wide variety of devices such as transistors, capacitors, resistors, combinations of these, and the like may be used to generate the structural and functional requirements of the design for the interconnect structure 100. The active and passive devices 112 may be formed using any suitable methods. Only a portion of the substrate 110 is illustrated in the figures, as this is sufficient to fully describe the illustrative embodiments.

The contact layer 120 is formed over the substrate 110. The contact layer 120 may comprise silicon, silicon germanium, silicon phosphide, silicon carbide, or a combination thereof. The contact layer 120 may include a doped region over the substrate 110. In some embodiments, the contact layer 120 is formed directly on or in a top surface of the substrate 110.

The dielectric layer 130 is formed over the contact layer 120. The dielectric layer 130 may be a single layer or a multi-layered structure. In some embodiments, the dielectric layer 130 has a thickness that varies with the applied technology, for example a thickness of about 500 angstroms (Å) to about 30000 angstroms (Å). The dielectric layer 130 may be formed of low-k dielectric, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PE-TEOS), fluorine-doped silicon oxide, carbon-doped silicon oxide, porous silicon oxide, porous carbon-doped silicon oxide, organic polymers, or silicone based polymers. In some embodiments, the low-k dielectric is associated with a dielectric constant (k) less than 3.9. For example, k is between about 1.5 and about 2.8. The dielectric layer 130 may be formed by atomic layer deposition (ALD), chemical vapor deposition (CVD), physical vapor deposition (PVD), or a combination thereof.

A contact structure 190 is formed to extend through the dielectric layer 130 to the contact layer 120. The contact structure 190 may be formed in an opening 132 in the dielectric layer 130, and the opening 132 exposes a portion 120b of the contact layer 120 (see FIG. 3 through FIG. 9 discussed below). The contact structure 190 includes the silicide layer 140 over the exposed portion 120b of the contact layer 120, the barrier layer 150 along sidewalls 132a and 132b of the opening 132, the alloy layer 160 over the barrier layer 150, the glue layer 170 over the alloy layer 160, and the conductive plug 180 over the glue layer 170.

Figure 7:
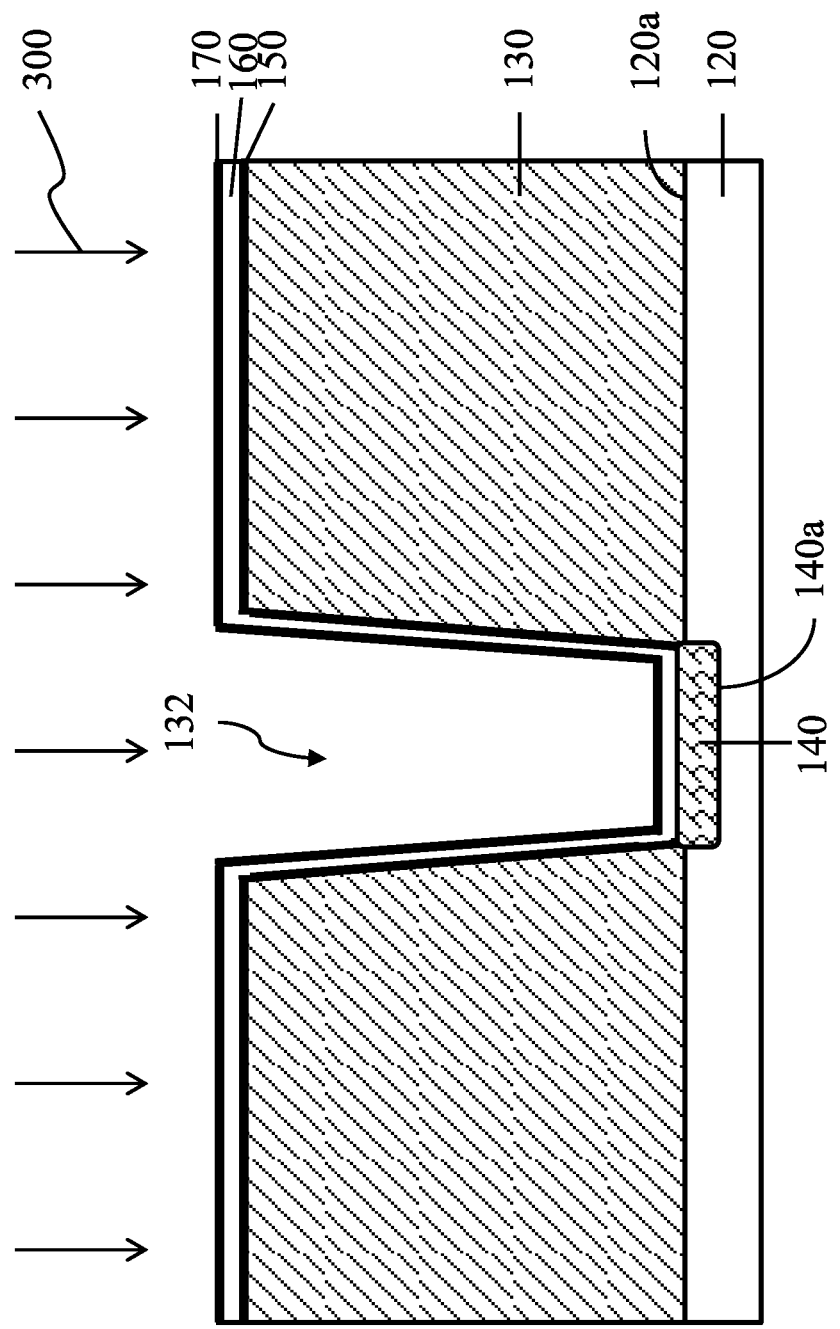

In some embodiments, the alloy layer 160 is conformally deposited over inner surfaces of the opening 132, and the glue layer 170 is deposited over the alloy layer 160. The alloy layer 160 will be partially or substantially consumed by a subsequent process (e.g., a thermal treatment 300 as illustrated in FIG. 7) of forming the silicide layer 140 and the barrier layer 150. In some embodiments, the alloy layer 160 comprises a main metal and an additive metal. The main metal may comprise nickel, cobalt, titanium, tungsten, or a combination thereof. The additive metal may comprise manganese. In some embodiments, a ratio of the additive metal to the main metal in the alloy layer 160 ranges from about 0.01 atomic percent (at %) to about 25 atomic percent (at %). In some embodiments, the alloy layer 160 has a thickness in a range from about 3 angstroms (Å) to about 50 angstroms (Å). In some embodiments, the glue layer 170 comprises titanium nitride, tantalum nitride, or a combination thereof. In some embodiments, the glue layer 170 has a thickness in a range from about 5 angstroms (Å) to about 50 angstroms (Å). The glue layer 170 improves the adhesion between the subsequently formed conductive plug 180 (see FIG. 9) and the alloy layer 160, and also prevents oxidation of the alloy layer 160 before the thermal treatment 300 in, for example, FIG. 7.

In some embodiments, the silicide layer 140 directly adjoins the contact layer 120. The silicide layer 140 provides a low resistance contact and good adhesion to the contact layer 120. The silicide layer 140 may have a surface 140a that extends lower than a top surface 120a of the contact layer 120 as some of the alloy layer 160 and the contact layer 120 may be consumed during the thermal treatment 300 (e.g., a silicidation process) to form the silicide layer 140. In some embodiments, an unreacted portion of the alloy layer 160 remains on the silicide layer 140. In some embodiments, the alloy layer 160 does not remain on the silicide layer 140. In some embodiments, the silicide layer 140 comprises nickel silicide, cobalt silicide, titanium silicide, tungsten silicide, or a combination thereof. In some embodiments, the silicide layer 140 has a thickness in a range from about 30 angstroms (Å) to about 300 angstroms (Å).

In some embodiments, the barrier layer 150 extends substantially along sidewalls of the contact structure 190 from the silicide layer 140 to a top surface 130a of the dielectric layer 130. During and/or after the thermal treatment 300, in some embodiments, the additive metal in the alloy layer 160 partially or completely diffuses to the surface of the dielectric layer 130. In some embodiments, the diffused additive metal reacts with the dielectric layer 130 to form the barrier layer 150. The barrier layer 150 is formed in a self-aligned manner at the boundary between the dielectric layer 130 and the alloy layer 160. In some embodiments, the barrier layer 150 has a thickness in a range from about 3 angstroms (Å) to about 30 angstroms (Å). In some embodiments, the formation of the barrier layer 150 consumes some of the dielectric layer 130 and the alloy layer 160. In some embodiments, the barrier layer 150 is a metal oxide layer because the oxygen existed in the dielectric layer 130 reacts with the additive metal in the alloy layer 160 during the thermal treatment 300. In some embodiments, the metal oxide layer comprises manganese oxide (MnOx) or manganese silicon oxide (MnSiyOz). In alternative embodiments, the metal oxide layer is made of TiOx, AlOx, CoOx, VOx, YOx, TcOx, ReOx, or a combination thereof. In some embodiments, the barrier layer 150 and the alloy layer 160 comprise a same chemical element. For example, the same chemical element is manganese. In some embodiments, the barrier layer 150 has a weight ratio of manganese to oxygen from about 0.1 to about 10. The barrier layer 150 may function as a barrier or protector to prevent a subsequently formed conductive material (e.g., a conductive plug 180) from diffusing into the dielectric layer 130.

The conductive plug 180 is formed on the glue layer 170 and may substantially fill the remaining portion of the opening 132 in the dielectric layer 130. In some embodiments, the conductive plug 180 has a top surface 180a that is substantially coplanar with the top surface 130a of the dielectric layer 130. In some embodiments, the conductive plug 180 comprises tungsten. The conductive plug 180 may be formed by a process including, but not limited to, ALD, CVD, PVD, sputtering, plating, or a combination thereof.

The interconnect structures of the present disclosure are not limited to the above-mentioned embodiments, and may have other different embodiments. To simplify the description and for the convenience of comparison between each of the embodiments of the present disclosure, corresponding components in each of the following embodiments are marked with the same numerals. For making it easier to compare the difference between the embodiments, the following description will detail the dissimilarities among different embodiments and the identical features will not be redundantly described.

As depicted in FIG. 1, in some embodiments, the interconnect structure 100 comprises a contact layer 120 over a substrate 110; a dielectric layer 130 having a recess 132 over the contact layer 120, the recess 132 being in contact with a portion 120b of the contact layer 120 (as illustrated in FIG. 4); a silicide layer 140 over the portion 120b of the contact layer 120; a metal oxide layer 150 along sidewalls 132a and 132b of the recess 132 (as illustrated in FIG. 4), the metal oxide layer 150 comprising a first metal; an alloy layer 160 over the metal oxide layer 150 and the silicide layer 140, the alloy layer 160 comprising the first metal and a second metal different from the first metal; a glue layer 170 over the alloy layer 160; and a conductive plug 180 over the glue layer 170. In some embodiments, the first metal comprises manganese. In some embodiments, the second metal comprises nickel, cobalt, titanium, tungsten, or a combination thereof.

Figure 2:
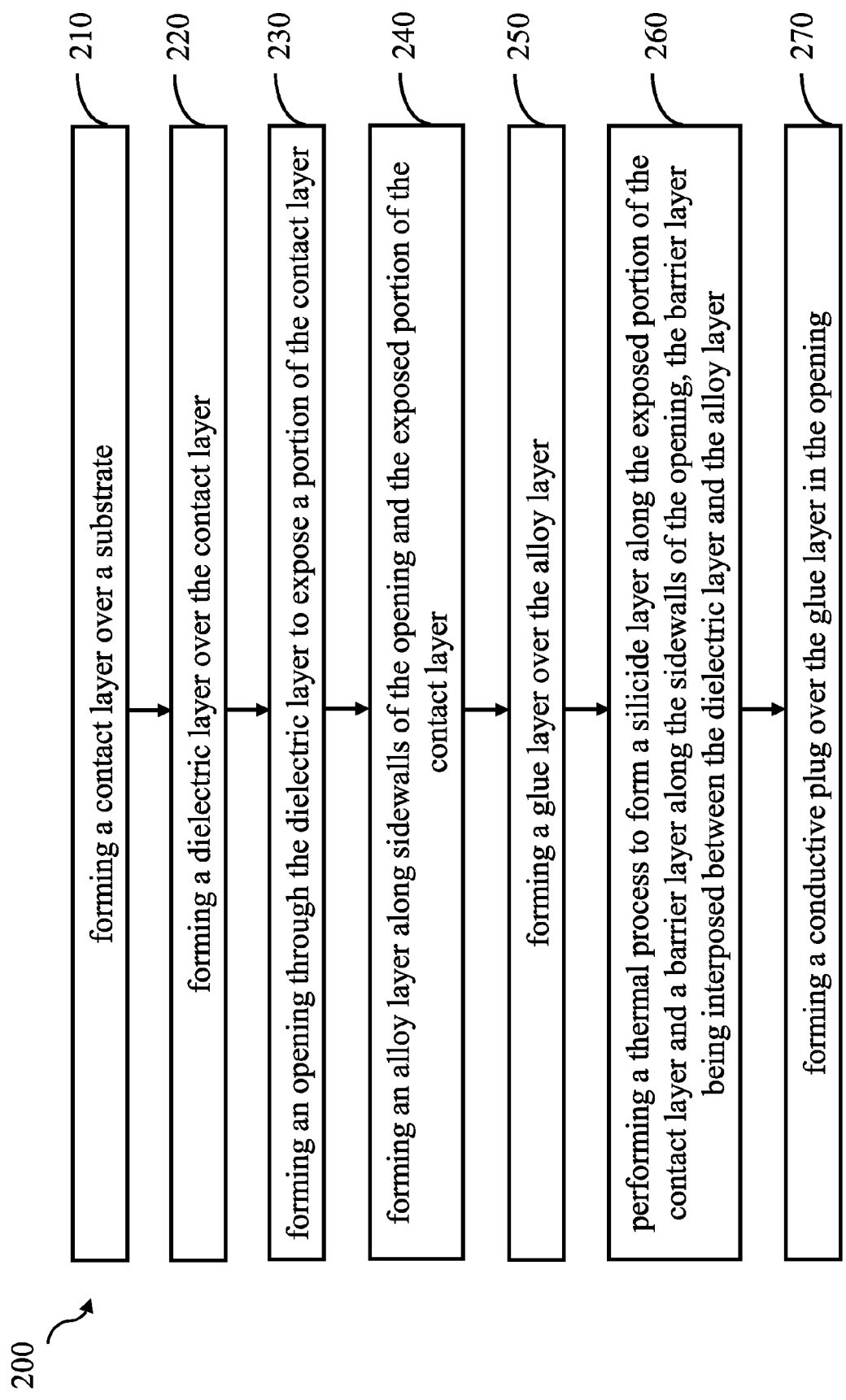
FIG. 2 is a flowchart of a method 200 of forming the interconnect structure 100 according to various aspects of the present disclosure.

FIG. 2 is a flowchart of a method 200 of forming the interconnect structure 100 according to various aspects of the present disclosure. It is understood that additional steps can be provided before, during, and after the method 200, and some of the steps described can be replaced or eliminated for other embodiments of the method 200. The method 200 begins at step 210 in which a contact layer 120 is formed over a substrate 110. The method 200 continues with step 220 in which a dielectric layer 130 is formed over the contact layer 120. The method 200 continues with step 230 in which an opening 132 is formed through the dielectric layer 130 to expose a portion 120b of the contact layer 120. The method 200 continues with step 240 in which an alloy layer 160 is formed along sidewalls 132a and 132b of the opening 132 and the exposed portion 120b of the contact layer 120. The method 200 continues with step 250 in which a glue layer 170 is formed over the alloy layer 160. The method 200 continues with step 260 in which a thermal treatment 300 is performed to form a silicide layer 140 along the exposed portion 120b of the contact layer 120 and to form a barrier layer 150 along the sidewalls 132a and 132b of the opening 132, the barrier layer 150 being interposed between the dielectric layer 130 and the alloy layer 160. The method 200 continues with step 270 in which a conductive plug 180 is formed over the glue layer 170 in the opening 132. The discussion that follows illustrates embodiments of the interconnect structure 100 that can be fabricated according to the method 200 of FIG. 2.

FIGS. 3-9 are cross-sectional views of the interconnect structure 100 at various stages of fabrication according to various aspects of the present disclosure. As depicted in step 210 in FIG. 2, the method 200 begins at step 210 by forming a contact layer 120 over a substrate 110 (as illustrated in FIG. 1). The contact layer 120 may include a doped region over the substrate 110. The contact layer 120 may be formed of silicon, silicon germanium, silicon phosphide, silicon carbide, the like, or a combination thereof. The contact layer 120 may be epitaxially grown from the substrate 110 or from some other intermediate structure. In some embodiments, the contact layer 120 is epitaxially grown in a recess formed in the substrate 110. In other embodiments, the contact layer 120 is formed by doping a portion of the substrate 110 with an implantation process. For example, the contact layer 120 may be a source region or a drain region of a transistor.

Figure 3:
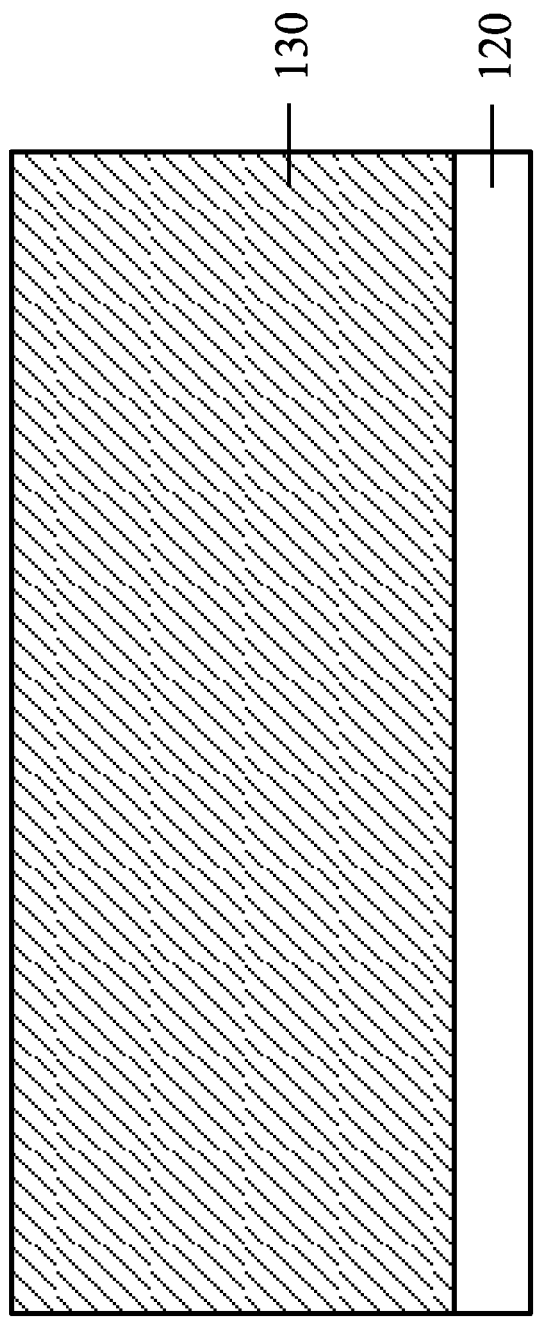
FIGS. 3-9 are cross-sectional views of the interconnect structure 100 at various stages of fabrication according to various aspects of the present disclosure.

As depicted in FIG. 3 and step 220 in FIG. 2, the method 200 continues with step 220 by forming a dielectric layer 130 over the contact layer 120. The dielectric layer 130 may be a single layer or a multi-layered structure. In some embodiments, the dielectric layer 130 has a thickness that varies with the applied technology, for example a thickness of about 500 angstroms (Å) to about 30000 angstroms (Å). In some embodiments, the dielectric layer 130 is silicon oxide, carbon-doped silicon oxide, a comparatively low dielectric constant (k value) dielectric material with a k value less than about 3.9, or a combination thereof. In some embodiments, the dielectric layer 130 is formed of a material, including low-k dielectric material, extreme low-k dielectric material, porous low-k dielectric material, and a combination thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 130 is deposited through any of a variety of techniques, such as CVD, PVD, ALD, remote plasma enhanced chemical vapor deposition (RPECVD), liquid source misted chemical deposition (LSMCD), coating, spin-coating, a spin-on-dielectric (SOD) process, or another process that is adapted to form a thin film layer over the substrate 110. In some embodiments, the dielectric layer 130 is an inter-layer dielectric (ILD).

As depicted in FIG. 4 and step 230 in FIG. 2, the method 200 continues with step 230 by forming an opening 132 through the dielectric layer 130 to expose a portion 120b of the contact layer 120. A bottom of the opening 132 is substantially coplanar with a top surface 120a of the contact layer 120. The opening 132 may be formed using acceptable photolithography and etching techniques such as, for example, an anisotropic dry etch. In some embodiments, the formation of the opening 132 includes a masking material such as a photoresist. In these embodiments, the photoresist (not shown) may be deposited and patterned over the dielectric layer 130. The photoresist may comprise a conventional photoresist material, such as a deep ultra-violet (DUV) photoresist, and may be deposited on a top surface of the dielectric layer 130, for example, by using a spin-on process to place the photoresist. However, any other suitable material or method of forming or placing the photoresist may alternatively be utilized. Once the photoresist has been formed, the photoresist may be exposed to energy, e.g. light, through a patterned reticle in order to induce a reaction in those portions of the photoresist exposed to the energy. The photoresist may then be developed, and portions of the photoresist may be removed forming openings in the photoresist, exposing portions of the top surface of dielectric layer 130 through the openings. After the photoresist is patterned, the dielectric layer 130 may be patterned to form the opening 132.

After the opening 132 is formed, an optional cleaning process may be performed to remove the native oxide or any residue from the etching process on the contact layer 120. The cleaning process may be performed using an HCl solution, and the cleaning time may be about one minute, for example. In some embodiments, the native oxide can be avoided by maintaining the exposed portion 120b of the contact layer 120 in a vacuum or in an oxygen or oxidizer free environment.

Figure 5:
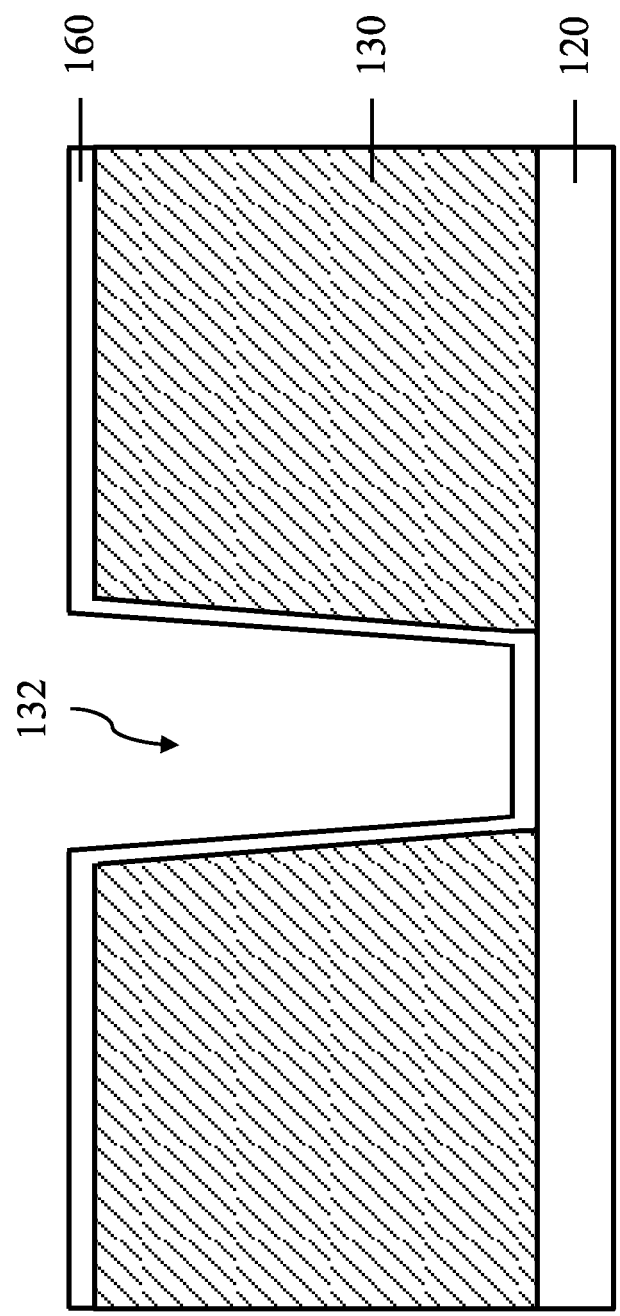

As depicted in FIG. 5 and step 240 in FIG. 2, the method 200 continues with step 240 by forming an alloy layer 160 along sidewalls 132a and 132b of the opening 132 and the exposed portion 120b of the contact layer 120. In some embodiments, the alloy layer 160 is formed by PVD, ALD, sputter deposition, the like, or a combination thereof. In some embodiments, the alloy layer 160 comprises a main metal and an additive metal. The main metal may comprise nickel, cobalt, titanium, tungsten, or a combination thereof. The additive metal may comprise manganese. In some embodiments, a ratio of the additive metal to the main metal in the alloy layer 160 ranges from about 0.01 atomic percent (at %) to about 25 atomic percent (at %). In some embodiments, the alloy layer 160 has a thickness in a range from about 3 angstroms (Å) to about 50 angstroms (Å). In some embodiments, the alloy layer 160 is conformally deposited to have a substantially uniform thickness along inner surfaces of the opening 132 and over the dielectric layer 130. In some embodiments, the alloy layer 160 is thicker over the bottom of the opening 132 and the dielectric layer 130 than it is along the sidewalls 132a and 132b of the opening 132.

Figure 6:
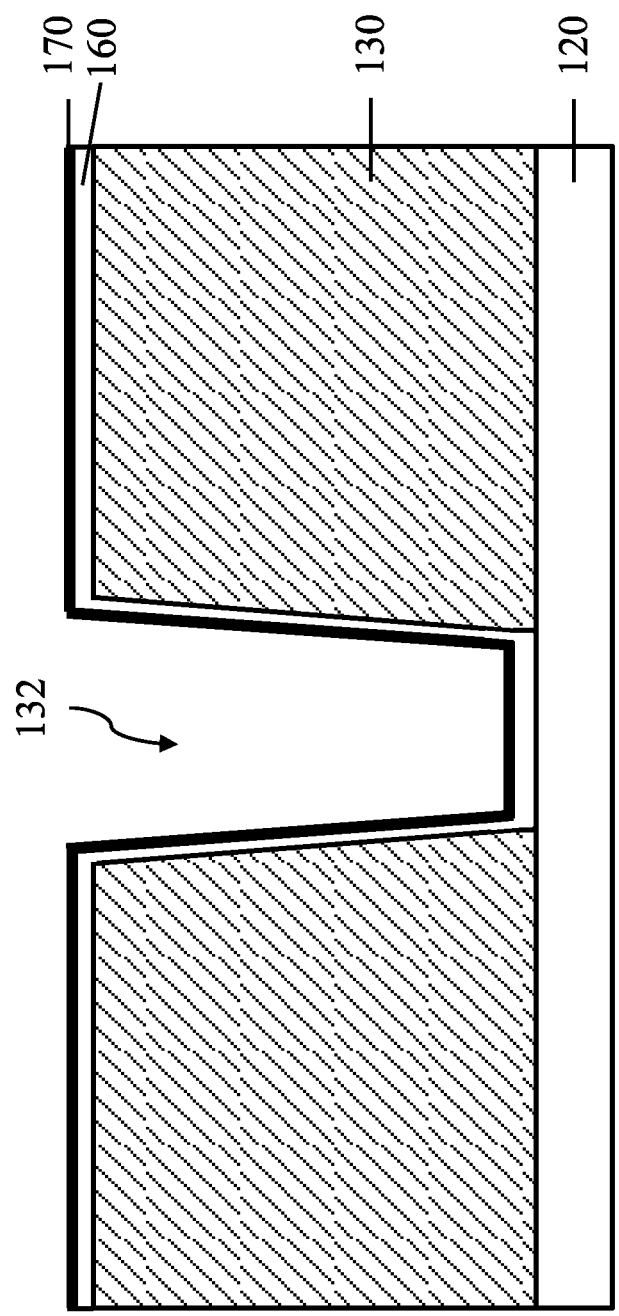

As depicted in FIG. 6 and step 250 in FIG. 2, the method 200 continues with step 250 by forming a glue layer 170 over the alloy layer 160. In some embodiments, the glue layer 170 is formed by CVD, PVD, ALD, the like, or a combination thereof. The glue layer 170 improves the adhesion between the subsequently formed conductive plug 180 (see FIG. 9) and the alloy layer 160, and also prevents oxidation of the alloy layer 160 before the thermal treatment 300 in, for example, FIG. 7. In some embodiments, the glue layer 170 comprises titanium nitride, tantalum nitride, or a combination thereof. In some embodiments, the glue layer 170 has a thickness in a range from about 5 angstroms (Å) to about 50 angstroms (Å). The glue layer 170 may be conformally deposited to have a substantially uniform thickness over the alloy layer 160.

As depicted in FIG. 7 and step 260 in FIG. 2, the method 200 continues with step 260 by performing a thermal treatment 300 to form a silicide layer 140 along the exposed portion 120b of the contact layer 120 and to form a barrier layer 150 interposed between the dielectric layer 130 and the alloy layer 160. In some embodiments, the thermal treatment 300 includes an annealing process. The annealing process may be performed using thermal soaking, spike annealing, flash annealing, laser annealing, the like, or a combination thereof. In some embodiments, the thermal treatment 300 is performed at a temperature from about 100 degrees Celsius (° C.) to about 900 degrees Celsius (° C.), in an atmosphere including process gases such as argon (Ar), nitrogen ($N_2$), the like, or a combination thereof, and at a pressure from about 770 Torr to about 850 Torr. In some embodiments, the thermal treatment 300 may be performed at a duration from about 10 minutes to about 600 minutes. In some embodiments, the thermal treatment 300 is performed using a CVD process, furnace, rapid thermal processing (RTP), hot plate equipment, or any of a variety of heat treatment techniques. The alloy layer 160 will be partially or substantially consumed by the thermal treatment 300 of forming the silicide layer 140 and the barrier layer 150.

The thermal treatment 300 causes the alloy layer 160 to react with the contact layer 120 to form the silicide layer 140. The silicide layer 140 may have a surface 140a that extends lower than a top surface 120a of the contact layer 120 as some of the alloy layer 160 and the contact layer 120 may be consumed during the thermal treatment 300 (e.g., a silicidation process) to form the silicide layer 140. After the silicide layer 140 is formed, in some embodiments, there remains an unreacted portion of the alloy layer 160 that was not converted into the silicide layer 140. In other embodiments, no alloy layer 160 remains on the silicide layer 140. In some embodiments, the silicide layer 140 comprises nickel silicide, cobalt silicide, titanium silicide, tungsten silicide, or a combination thereof. In some embodiments, the silicide layer 140 has a thickness in a range from about 30 angstroms (Å) to about 300 angstroms (Å). The silicide layer 140 provides a low resistance contact and good adhesion to the contact layer 120.

During and/or after the thermal treatment 300, in some embodiments, the additive metal in the alloy layer 160 partially or completely diffuses to the surface of the dielectric layer 130. In some embodiments, the diffused additive metal reacts with the dielectric layer 130 to form the barrier layer 150. The barrier layer 150 is formed in a self-aligned manner at the boundary between the dielectric layer 130 and the alloy layer 160. In some embodiments, the barrier layer 150 has a thickness in a range from about 3 angstroms (Å) to about 30 angstroms (Å). In some embodiments, the formation of the barrier layer 150 consumes some of the dielectric layer 130 and the alloy layer 160. In some embodiments, the barrier layer 150 is a metal oxide layer because the oxygen existed in the dielectric layer 130 reacts with the additive metal in the alloy layer 160 during the thermal treatment 300. In some embodiments, the metal oxide layer comprises manganese oxide (MnOx) or manganese silicon oxide (MnSiyOz). In alternative embodiments, the metal oxide layer is made of TiOx, AlOx, CoOx, VOx, YOx, TcOx, ReOx, or a combination thereof. In some embodiments, the barrier layer 150 and the alloy layer 160 comprise a same chemical element. For example, the same chemical element is manganese. In some embodiments, the barrier layer 150 has a weight ratio of manganese to oxygen from about 0.1 to about 10. The barrier layer 150 may function as a barrier or protector to prevent a subsequently formed conductive material (e.g., a conductive plug 180 as illustrated in FIG. 9) from diffusing into the dielectric layer 130.

Figure 8:
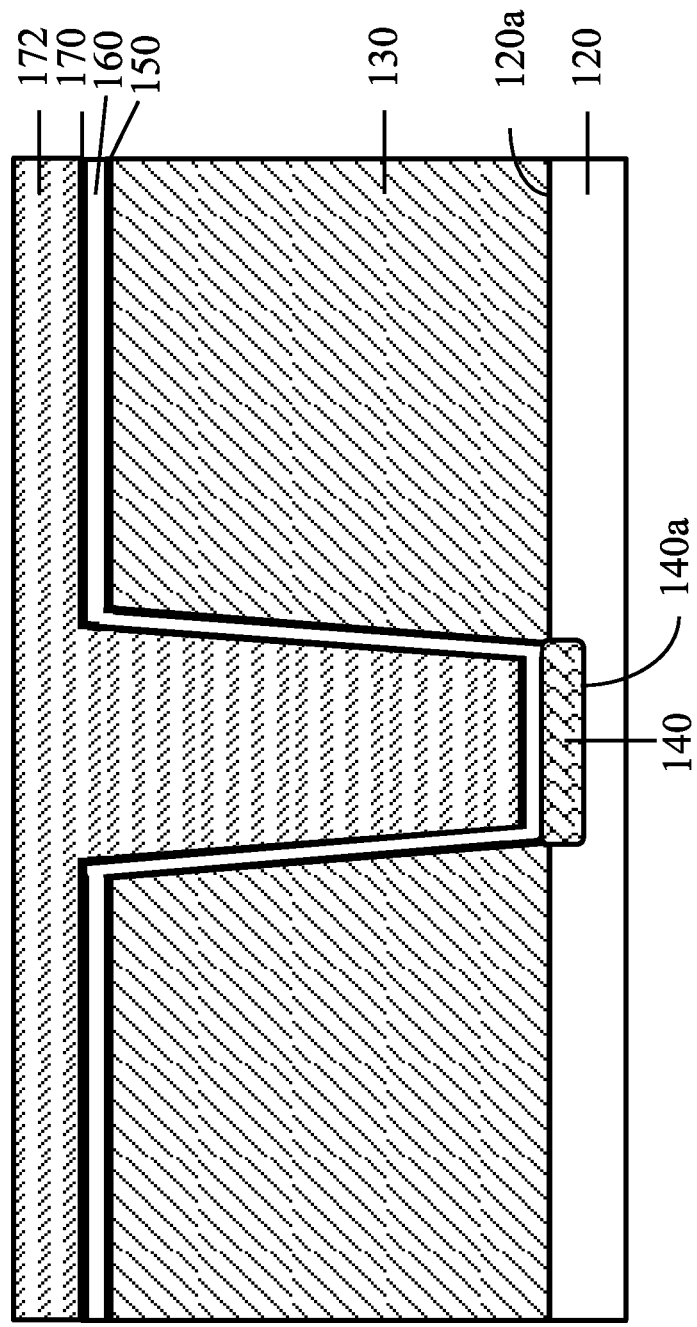
Figure 9:
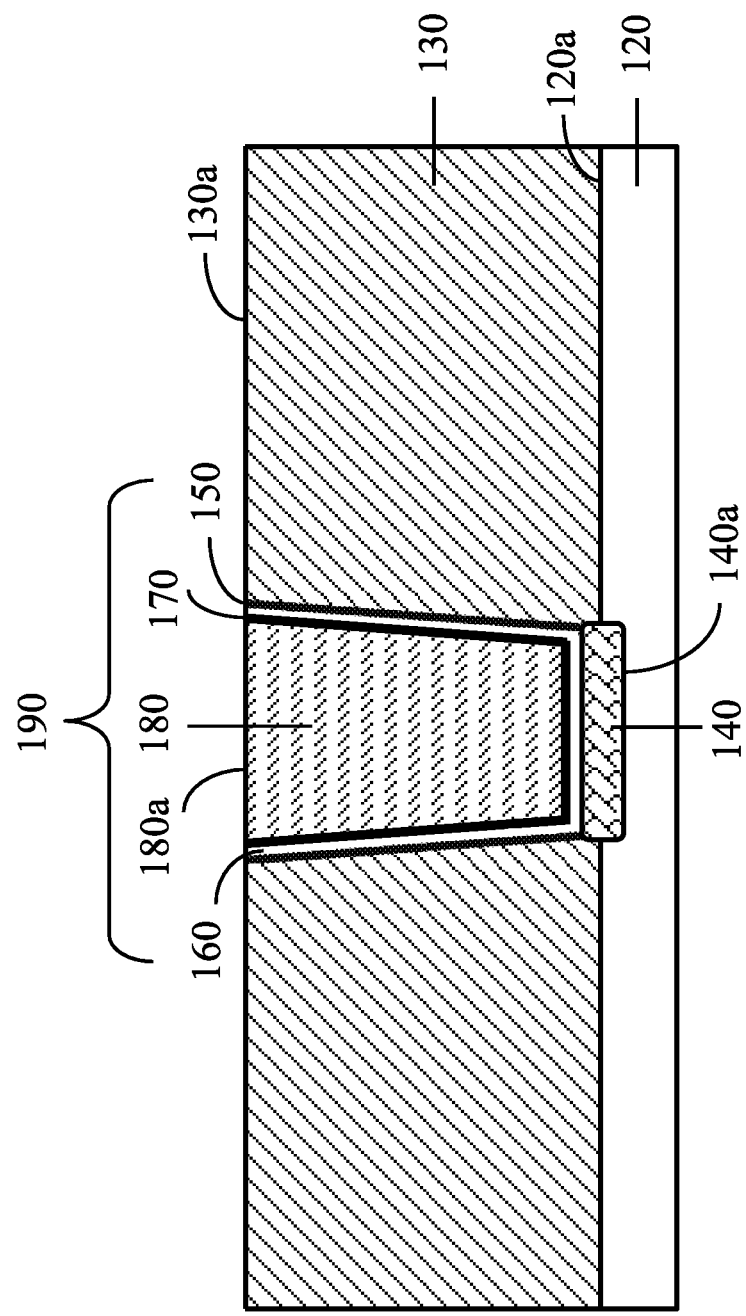

As depicted in FIG. 8, FIG. 9, and step 270 in FIG. 2, the method 200 continues with step 270 by forming a conductive plug 180 over the glue layer 170 in the opening 132. FIG. 8 illustrates filling the opening 132 with a conductive layer 172. In some embodiments, the conductive layer 172 fills the opening 132 and also extends over the glue layer 170. The conductive layer 172 will form the subsequently formed conductive plug 180 as illustrated in FIG. 9. In some embodiments, the conductive layer 172 is formed of tungsten. In alternative embodiments, the conductive layer 172 includes other metal(s) or metal alloy(s) such as aluminum, copper, titanium nitride, tantalum nitride, the like, or a combination thereof. The formation of the conductive layer 172 may be performed using CVD, ALD, PVD, sputtering, the like, or a combination thereof.

In the embodiments where the conductive layer 172 extends over the glue layer 170, a planarization process may be performed on the conductive layer 172 to form the conductive plug 180 as illustrated in FIG. 9. In some embodiments, the planarization process is a chemical mechanical polishing (CMP) process, an etching process, the like, or a combination thereof. After the planarization process, the top surface 180a of the conductive plug 180 is substantially coplanar with the top surface 130a of the dielectric layer 130. As illustrated in FIG. 9, the silicide layer 140, the barrier layer 150, the alloy layer 160, the glue layer 170, and the conductive plug 180 form the contact structure 190.

Accordingly, the processing discussed above with reference to FIG. 9 may form a novel barrier layer 150 in a self-aligned manner at the boundary between the dielectric layer 130 and the alloy layer 160 to impede diffusion of the conductive material into the dielectric layer 130. Problems associated with low yield and bad reliability may be reduced and/or avoided. Thus, Applicant's method may achieve the desired device performance characteristics.

In some embodiments, the method 200 further comprises forming an etch stop layer (ESL) over the contact structure 190 and the dielectric layer 130. The ESL may be formed using a suitable process such as ALD, CVD, PVD, MBE, spin-on, or combinations thereof. The material for the ESL includes SiO, SiC, SiN, SiOC, SiON, SiCN, TiN, AlN, AlON, TEOS, hard black diamond (HBD), or the like. Alternatively, the ESL may be formed by depositing and annealing a metal oxide material, which includes Hf, $HfO_2$, or Al. In some embodiments, the ESL has a thickness in a range from about 10 angstroms (Å) to about 300 angstroms (Å).

The methods of the present disclosure are not limited to be used by a planar device on the substrate and can be applied to a non-planar device as well, such as a fin-like field effect transistor (FinFET) or a nanowire device. Based on the discussions above, it can be seen that by using the methods of the present disclosure, diffusion of the conductive material (of the conductive plug) into the dielectric layer is impeded by forming a barrier layer in a self-aligned manner at the boundary between the dielectric layer and the alloy layer. The thickness of the barrier layer is substantially conformal along the sidewalls of the contact structure. As a result, the yield and reliability of the device can be well controlled by using the methods of the present disclosure.

One of the broader forms of the present disclosure involves an interconnect structure. The interconnect structure comprises a contact layer over a substrate; a dielectric layer over the contact layer, wherein the dielectric layer has an opening, the opening exposing a portion of the contact layer; a silicide layer over the exposed portion of the contact layer; a barrier layer along sidewalls of the opening; an alloy layer over the barrier layer; a glue layer over the alloy layer; and a conductive plug over the glue layer.

Another of the broader forms of the present disclosure involves an interconnect structure. The interconnect structure comprises a contact layer over a substrate; a dielectric layer having a recess over the contact layer, the recess being in contact with a portion of the contact layer; a silicide layer over the portion of the contact layer; a metal oxide layer along sidewalls of the recess, the metal oxide layer comprising a first metal; an alloy layer over the metal oxide layer and the silicide layer, the alloy layer comprising the first metal and a second metal different from the first metal; a glue layer over the alloy layer; and a conductive plug over the glue layer.

Still another of the broader forms of the present disclosure involves a method of forming an interconnect structure. The method comprises forming a contact layer over a substrate; forming a dielectric layer over the contact layer; forming an opening through the dielectric layer to expose a portion of the contact layer; forming an alloy layer along sidewalls of the opening and the exposed portion of the contact layer; forming a glue layer over the alloy layer; performing a thermal treatment to form a silicide layer along the exposed portion of the contact layer and to form a barrier layer interposed between the dielectric layer and the alloy layer; and forming a conductive plug over the glue layer in the opening.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
 a contact layer over a substrate;
 a dielectric layer over the contact layer, wherein the dielectric layer has an opening, the opening comprising an exposed portion of the contact layer;
 a silicide layer over the exposed portion of the contact layer;
 a barrier layer along sidewalls of the opening;
 an alloy layer over the barrier layer, the barrier layer interposed between the alloy layer and the dielectric layer, the alloy layer over and in contact with the silicide layer;
 a glue layer over the alloy layer; and
 a conductive plug over the glue layer;
 wherein:
  the barrier layer comprises manganese oxide (MnOx) or manganese silicon oxide (MnSiyOz);
  the alloy layer comprises a main metal and an additive metal; and
  a ratio of the additive metal to the main metal ranges from about 0.01 atomic percent (at %) to about 25 atomic percent (at %).

2. The interconnect structure of claim 1, wherein the contact layer comprises silicon, silicon germanium, silicon phosphide, silicon carbide, or a combination thereof.

3. The interconnect structure of claim 1, wherein the silicide layer comprises nickel silicide, cobalt silicide, titanium silicide, tungsten silicide, or a combination thereof.

4. The interconnect structure of claim 1, wherein the silicide layer has a thickness in a range from about 30 angstroms (Å) to about 300 angstroms (Å).

5. The interconnect structure of claim 1, wherein the barrier layer has a thickness in a range from about 3 angstroms (Å) to about 30 angstroms (Å).

6. The interconnect structure of claim 1, wherein the main metal comprises nickel, cobalt, titanium, tungsten, or a combination thereof.

7. The interconnect structure of claim 1, wherein the additive metal comprises manganese.

8. The interconnect structure of claim 1, wherein the alloy layer has a thickness in a range from about 3 angstroms (Å) to about 50 angstroms (Å).

9. The interconnect structure of claim 1, wherein the barrier layer and the alloy layer comprise a same chemical element.

10. The interconnect structure of claim 9, wherein the same chemical element is manganese.

11. The interconnect structure of claim 1, wherein the glue layer comprises titanium nitride, tantalum nitride, or a combination thereof.

12. The interconnect structure of claim 1, wherein the glue layer has a thickness in a range from about 5 angstroms (Å) to about 50 angstroms (Å).

13. An interconnect structure, comprising:
 a contact layer over a substrate;
 a dielectric layer having a recess over the contact layer, the recess being in contact with a portion of the contact layer;
 a silicide layer over the portion of the contact layer;
 a metal oxide layer along sidewalls of the recess, the metal oxide layer comprising at least one of the manganese oxide (MnOx) or manganese silicon oxide (MnSiyOz);
 an alloy layer over the metal oxide layer and the silicide layer, the alloy layer comprising a first metal and a second metal different from the first metal, the first metal comprising manganese, the metal oxide layer interposed between the alloy layer and the dielectric layer, wherein the alloy layer is in contact with the silicide layer, and ratio of an additive metal to a main metal in the alloy layer ranges from about 0.01 atomic percent (at %) to about 25 atomic percent (at %);

a glue layer over the alloy layer; and a conductive plug over the glue layer.

14. The interconnect structure of claim 13, wherein the second metal comprises nickel, cobalt, titanium, tungsten, or a combination thereof.

15. A semiconductor structure, comprising:

a contact layer over a substrate, the contact layer having a top surface;

a dielectric layer over the top surface, wherein the dielectric layer comprises a recess, the recess comprising an exposed portion of the contact layer below the top surface;

a silicide layer on the exposed portion of the contact layer;

a barrier layer lining sidewall portions of the recess;

an alloy layer over and in contact with the silicide layer, the alloy layer over the barrier layer;

an adhesion layer over the alloy layer; and a conductive material over the adhesion layer, the conductive material substantially filling the recess;

wherein:

the barrier layer comprises manganese oxide (MnOx) or manganese silicon oxide (MnSiyOz); and a ratio of an additive metal to a main metal in the alloy layer ranges from about 0.01 atomic percent (at %) to about 25 atomic percent (at %).

16. The interconnect structure of claim 13, wherein the contact layer comprises silicon, silicon germanium, silicon phosphide, silicon carbide, or a combination thereof.

17. The interconnect structure of claim 13, wherein the silicide layer comprises nickel silicide, cobalt silicide, titanium silicide, tungsten silicide, or a combination thereof.

18. The semiconductor structure of claim 15, wherein the contact layer comprises silicon, silicon germanium, silicon phosphide, silicon carbide, or a combination thereof.

19. The semiconductor structure of claim 15, wherein the silicide layer comprises nickel silicide, cobalt silicide, titanium silicide, tungsten silicide, or a combination thereof.

20. The semiconductor structure of claim 15, wherein the adhesion layer comprises titanium nitride, tantalum nitride, or a combination thereof.

* * * * *